US009325290B1

(12) United States Patent
Tsironis

(10) Patent No.: US 9,325,290 B1
(45) Date of Patent: Apr. 26, 2016

(54) IMPEDANCE TUNER WITH ADJUSTABLE ELECTRICAL LENGTH

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 26 days.

(21) Appl. No.: 14/492,129

(22) Filed: Sep. 22, 2014

(51) Int. Cl.
*H03H 7/38* (2006.01)
*H03H 7/40* (2006.01)
*H01P 1/28* (2006.01)
*H03H 1/00* (2006.01)

(52) U.S. Cl.
CPC .. *H03H 7/40* (2013.01); *H01P 1/28* (2013.01); *H03H 7/38* (2013.01); *H03H 2001/0021* (2013.01)

(58) Field of Classification Search
CPC .............. H03H 7/38; H03H 7/40; H01P 1/28; H01P 5/04
USPC .................................... 333/32, 33, 17.3, 263
See application file for complete search history.

(56) References Cited

U.S. PATENT DOCUMENTS 6,674,293 B1 1/2004 Tsironis
7,135,941 B1 11/2006 Tsironis
8,427,255 B1 * 4/2013 Tsironis .................... H01P 5/04 333/17.3
8,975,988 B1 * 3/2015 Tsironis .................... H01P 5/04 333/17.3

* cited by examiner

*Primary Examiner* — Stephen E Jones

(57) ABSTRACT

Single and multi-probe slide screw impedance tuners use a slabline filled with dielectric and the same probe and center conductor as in air. The dielectric filling reduces the overall tuner length by a factor of $1/\sqrt{\in_r}$. The increase in loss, and associated reduction in reflection factor, is partly compensated by the shorter size and travel of the probes. A typical length reduction is 40%. Using low loss oil reduces the electric field between probe and center conductor and increases Corona threshold; lubrication of sliding contact between probe and slabline walls and cooling of the center conductor are additional benefits. Probe grounding is established either by adjustable top mounted conductive slabs or spring loaded grounding contact on the probes. The method is most effective for tuners with lowest frequency between 100 and 200 MHz and harmonic tuners with lowest frequency between 200 and 400 MHz.

12 Claims, 13 Drawing Sheets a)

b)

| | Epsilon | sqrt(epsilon) | tan delta | tan delta / sqrt(epsilon) |
|---|---|---|---|---|
| Teflon | 2.0 | 1.4 | .00028 | .000198 |
| Acetone | 23.0 | 4.8 | .05000 | .010426 |
| Water | 80.0 | 8.9 | .01000 | .001118 |
| Mineral oil | 2.2 | 1.5 | .00016 | .000108 |
| Silicon oil | 2.7 | 1.6 | .00010 | .000061 |
| Castor oil | 4.6 | 2.1 | .00100 | .000466 |
| ethanol | 25.8 | 5.1 | .05000 | .009844 |
| methanol | 32.0 | 5.7 | .90000 | .159099 |
| ester oil | 3.2 | 1.8 | .00015 | .000084 |
| air | 1.0 | 1.0 | .000000 | .000000 |

Figure 13 (prior art)

IMPEDANCE TUNER WITH ADJUSTABLE ELECTRICAL LENGTH

PRIORITY CLAIM

Not applicable

CROSS-REFERENCE TO RELATED ARTICLES

1. Load Pull System: http://www.microwaves101.com/encyclopedia/loadpull.cfm
2. "Computer Controlled Microwave Tuner—CCMT," Product Note 41, Focus Microwaves, January 1998
3. Characteristic Impedance: http://www.microwaves101.com/encyclopedias/306-characteristic-impedance.
4. Tsironis, U.S. Pat. No. 7,135,941, Triple probe automatic slide screw load pull tuner and method
5. "MPT, a universal Multi-Purpose Tuner," Product Note 79, Focus Microwaves, October 2004.
6. "On wafer Load Pull Tuner Setups: A design help", Application Note 48, Focus Microwaves, December 2001.
7. Tsironis, U.S. Pat. No. 6,674,293, Adaptable pre-matched tuner system and method.
8. S-parameter Basics: http://www.microwaves101.com/encyclopedia/sparameters.cfm
9. Relative Permittivity—Dielectric Constant: http://www.engineeringtoolbox.com/relative-permittivity-d_1660.html
10. Tsironis, U.S. patent application Ser. No. 13/798,304, An Impedance Tuner Using Dielectrically Filled Airline.

BACKGROUND OF THE INVENTION

Prior Art

This invention relates to low noise and high power (nonlinear) testing of microwave transistors (DUT) in the frequency and time domain for Noise and Load Pull measurements (see ref. 1).

RF impedance tuners (see ref. 2), are used to test electrical components, like transistors, in cellular telephones and other electronic products to optimize performance. A RF tuner helps determine the best circuit environment for optimal performance based on an electrical quantity called "impedance", the ratio between voltage and current applied to a device. Impedance tuners can create a wide range of impedances to allow testing at different conditions. Automated slide screw tuners are the preferred solution for this type of testing (see ref. 2). In the case of noise measurements the tuners are used to generate arbitrary source impedances and appropriate software is then used to extract the noise parameters. Impedances (Z) are related to reflection factors (Γ) through the relation: $\Gamma=(Z-Zo)/(Z+Zo)$, whereby Zo is the characteristic impedance (see ref. 3) of the transmission line of the test system; typical value of Zo is 50Ω. A test setup for power measurements (load pull) is shown in FIG. 1.

A wideband slide screw tuner (FIG. 2) uses a slotted airline (slabline) (25) with coaxial connectors attached at both ends and a mobile carriage (23) which slides along the slabline and carries a metallic probe (21, 24), which is insertable into the slot of the slabline. By approaching to the center conductor (27) the probe creates controllable capacitive coupling between the center conductor and the ground walls of the slabline and thus a controllable reflection factor (FIG. 2*b*). To cover 360 degrees of reflection factor the carriage (and the probe) must travel at least one half of a wavelength along the slabline (22) (FIG. 2*a*).

Harmonic impedance tuners have been introduced in 2000 and 2004 (FIGS. 3 and 4, see ref. 4 and 7). They comprise a low loss slotted airline (slabline) with coaxial connectors attached at both ends and a number of independent wideband probes (41, 44 and 45) attached to mobile carriages (43) and insertable into and movable horizontally inside the slot of the slabline (42). To tune independently three frequencies, harmonic or not, it has been shown experimentally, that there is need for three such probes (41, 44 and 45), see ref. 5. Each probe is attached to and positioned by a precision remotely controlled gear mechanism in a carriage (43) (FIGS. 2, 3) and must travel one half a wavelength (λ/2) along the axis of the slabline. A three-frequency harmonic tuner is therefore at least three times longer than a wideband tuner with the same lowest frequency of operation.

The main shortcoming of such tuners (see ref. 5) is their horizontal size and weight due to the length of the slabline. In order to generate arbitrary reflection factors (impedances) at any frequency, each probe and associated carriage must move horizontally over at least one half of a wavelength (λ/2) at the fundamental frequency Fo (FIG. 4) this means that the lowest fundamental frequency determines the length of the tuner.

The electrical wave length in air is λ[cm]=30/Frequency [GHz].

In a practical tuner apparatus (FIGS. 2*a*, 4) the size of the additional supporting items, a) the width of the mobile carriages themselves (LC) and b) the thickness of the side-walls (LW) of the tuner housing, add to the overall tuner length. In practical terms the minimum overall length of the slabline of a three carriage harmonic tuner, without the size of the input and output connectors, is: L=3*λ/2+3*carriage(LC)+2*sidewalls(LW) (FIG. 4).

The present invention describes a method allowing reducing the overall linear length of such a tuner, with minimal effect on its RF performance, by adjusting the electrical wavelength inside the slabline and by consequence the overall tuner size; this is done by filling all or part of the slabline with a dielectric material with a dielectric coefficient $\epsilon_r>1$ (epsilon>1), which will have higher loss than air, without modifying the center conductor, the coaxial connectors and the tuning probe. The method entails a compromise between best RF performance and smallest mechanical size and weight.

BRIEF DESCRIPTION OF THE DRAWINGS

The invention and its mode of operation will be better understood from the following detailed description when read when read with the appended drawings in which:

FIG. 13 depicts prior art, a table of dielectric constant and loss of typical dielectric material.

DETAILED DESCRIPTION OF THE INVENTION

The invention discloses the concept of reducing the length of single or multi-carriage impedance tuners, by using a low loss dielectric material to fill the slabline cavity and reduce the effective wavelength of the signals transmitted through the tuner, and thus the overall length of the slabline itself. In a preferred embodiment the dielectric material is a fluid, wherein oil is an obvious choice. Other than in prior art (see ref. 10) the apparatus disclosed here allows re-using the same slabline components, coaxial connectors, center conductor and reflective probe while maintaining the same tuner characteristic impedance Zo (typically=50Ω) when adding or changing dielectric fluid. This is possible by adjusting a) the width of the channel of the slabline and b) by establishing an adjustable ground contact with the reflective probe. A number of embodiments of the basic idea are shown in FIGS. 6 to 10.

Figure 5:
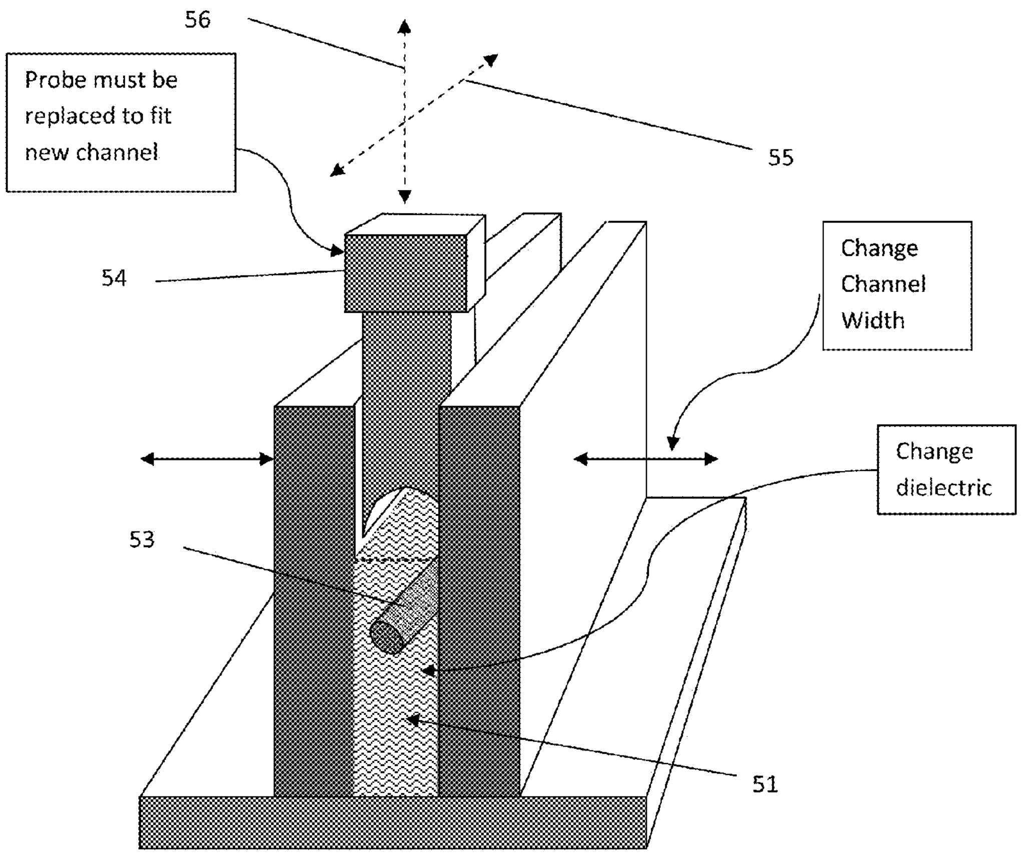
FIG. 5 depicts a perspective view and cross section of a tuner slabline filled with liquid dielectric material and the operations needed to keep the characteristic impedance constant when changing dielectric.

The apparatus in FIG. 5 does allow changing the dielectric material in the slabline and keeping Zo constant by widening or narrowing the channel width (51) and keeping the same center conductor (53). But, when the channel widens, the probe (54) will lose its ground contact; or if the channel narrows the probe cannot enter into the slabline slot. In the configuration of FIG. 5 a new probe must be used, every time the dielectric changes, which probe must have the same thickness as the channel width (51). This embodiment is therefore impractical, in view of the complexity of the mechanical operations.

Figure 6:
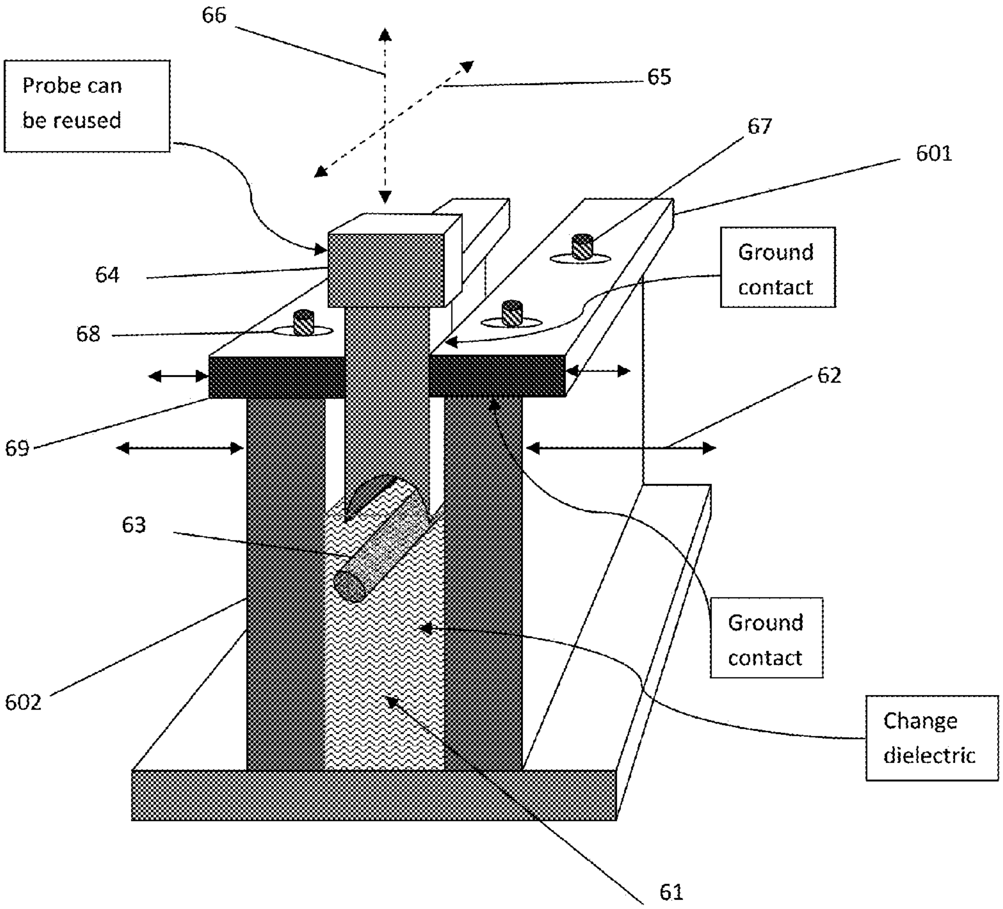
FIG. 6 depicts a perspective of a mechanism allowing changing the dielectric material without changing the probe and keeping the characteristic impedance constant.
Figure 7:
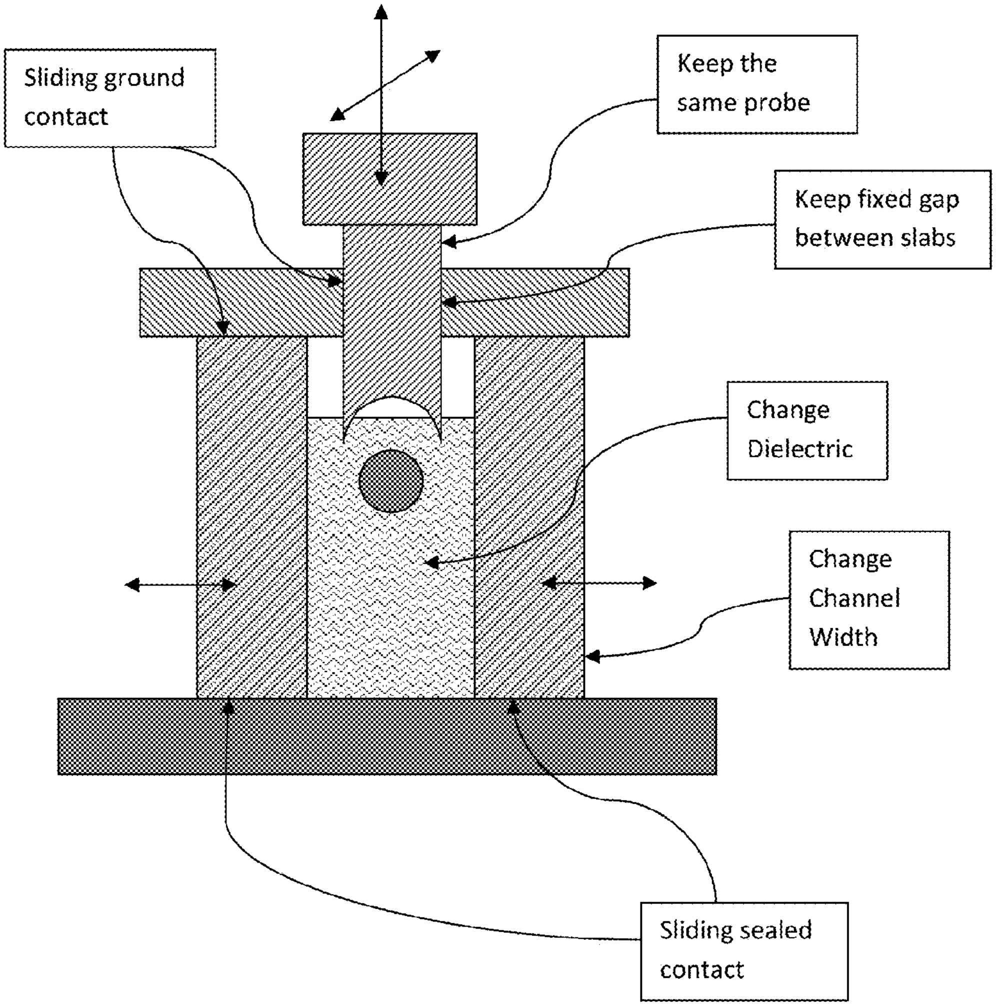
FIG. 7 depicts a cross section of the mechanism of FIG. 6 with further definitions and necessary operations.
Figure 8:
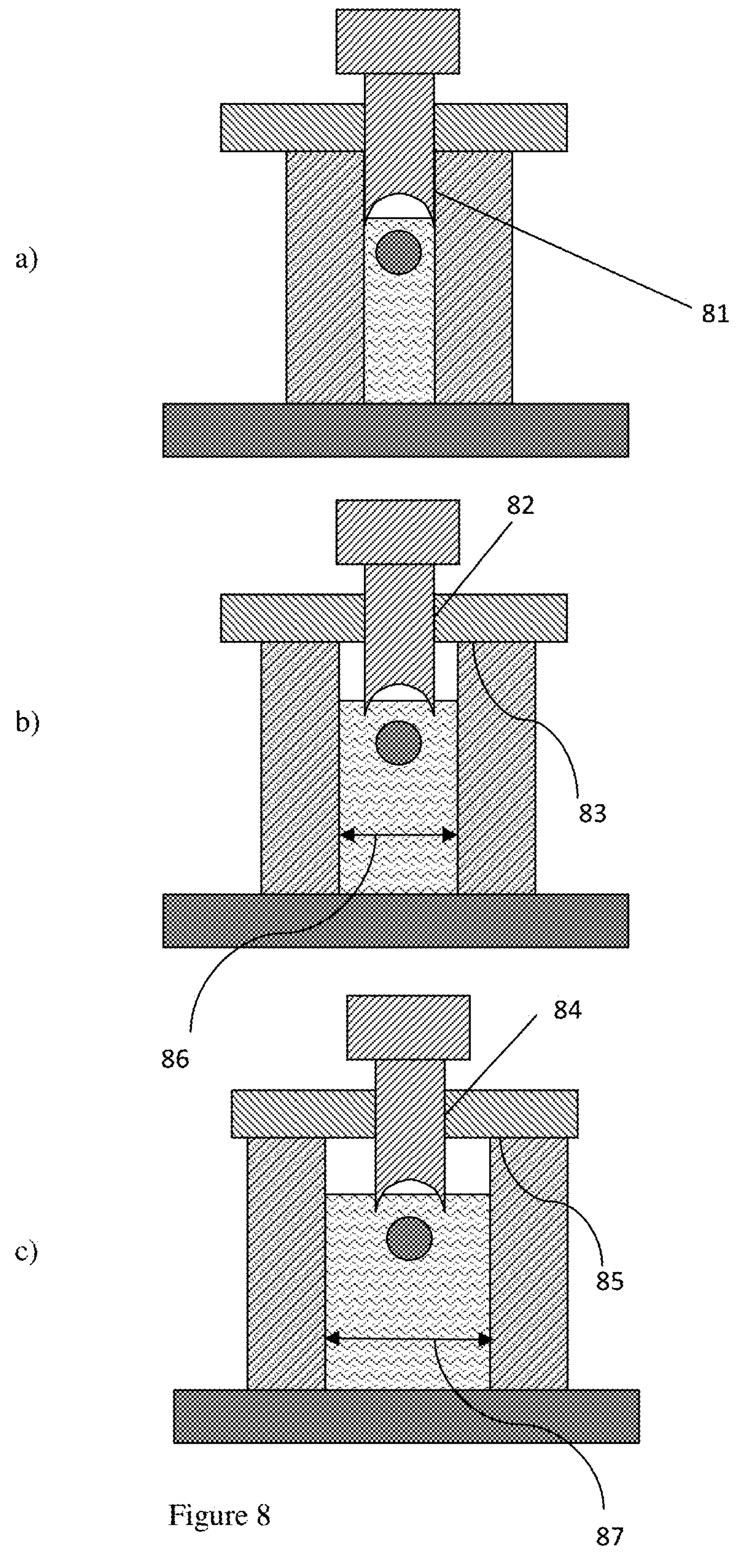
FIG. 8 depicts cross section of three extreme cases of changing the dielectric material to shorten the tuner length but keeping the characteristic impedance constant: a) lowest epsilon, longest tuner, c) highest epsilon, shortest tuner.

A more adaptable embodiment is shown in FIGS. 6 to 8: In FIG. 6 the slabline channel is variable to adapt to the dielectric material (61), as before in FIG. 5. However here the same reflective probe can be used, since the two conductive slabs (69) and (601) establish adjustable and reliable grounding contact between the probe (64) and the slabline walls (602). The slabs (69) and (601) are mounted on top of the slabline walls (602) and are fastened with screws (67) which traverse the slabs in oval holes (68) to allow for adjustable mounting and good contact with the probe (64). Thus, every time the dielectric changes, the slabline walls (602) are adjusted (62) to keep Zo constant and the slabs (69) and (601) are adjusted to compensate the change in channel width. After that the probe (64) can move in horizontal (65) and vertical (66) direction as before still having ground contact, as before. FIG. 7 is a simplified clear cross section view of the mechanism depicted in FIG. 6.

FIG. 8 depicts three extreme states of the same apparatus: in FIG. 8*a*) the slabline walls make direct ground contact (81) with the probe. This is a typical case where the dielectric material is air (epsilon=1). In FIG. 8*b*) a dielectric with higher electrical permittivity epsilon (example, epsilon=2) is used: the slabline walls are expanded and the channel widens (86). Instead the grounding slabs on top of the slabline keep the same position as in FIG. 8*a*) relative to the probe and thus the grounding contact is now at position (82). In FIG. 8*c*) a dielectric with electrical permittivity epsilon=4 is used and therefore the slabline walls must be moved farther away (87); the top slabs again adjust to keep ground contact (84) with the probe. This way the overall length of the tuner can be reduced by a factor of 2 (=sqrt(epsilon)) still using the same components (center conductor, slabline walls, coaxial connectors and reflective probe).

Figure 9:
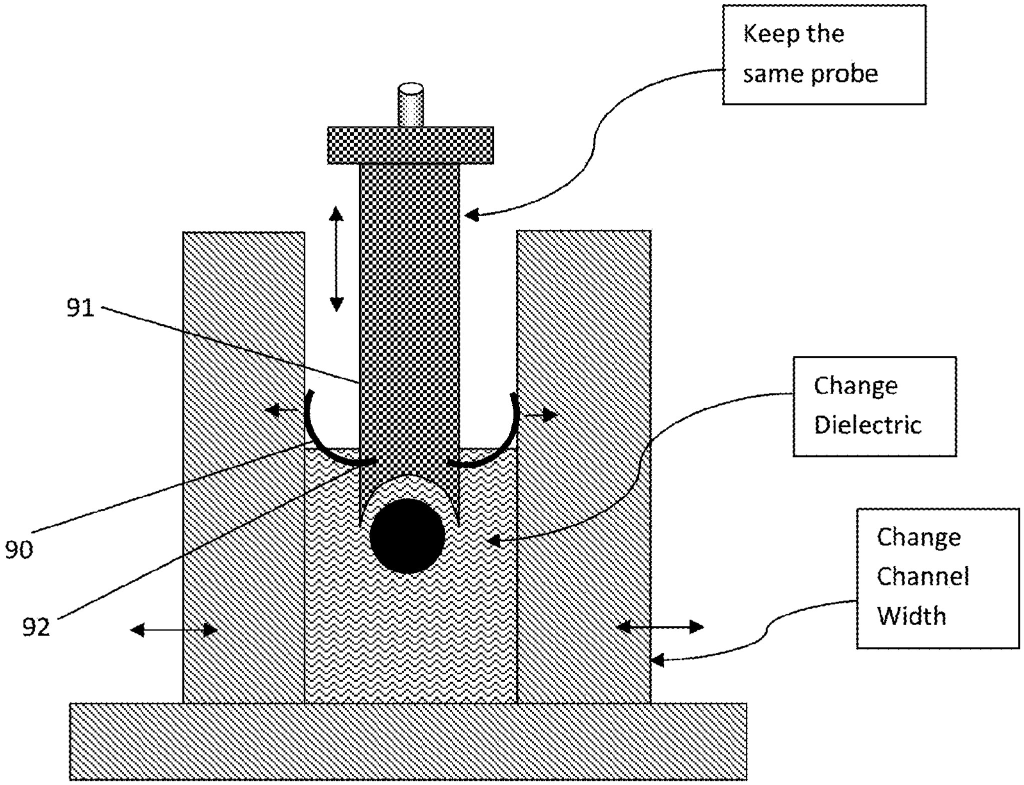
FIG. 9 depicts cross section of grounding mechanism of a probe for adjustable slabline channel width for using various dielectric materials and keeping the characteristic impedance constant.
Figure 10:
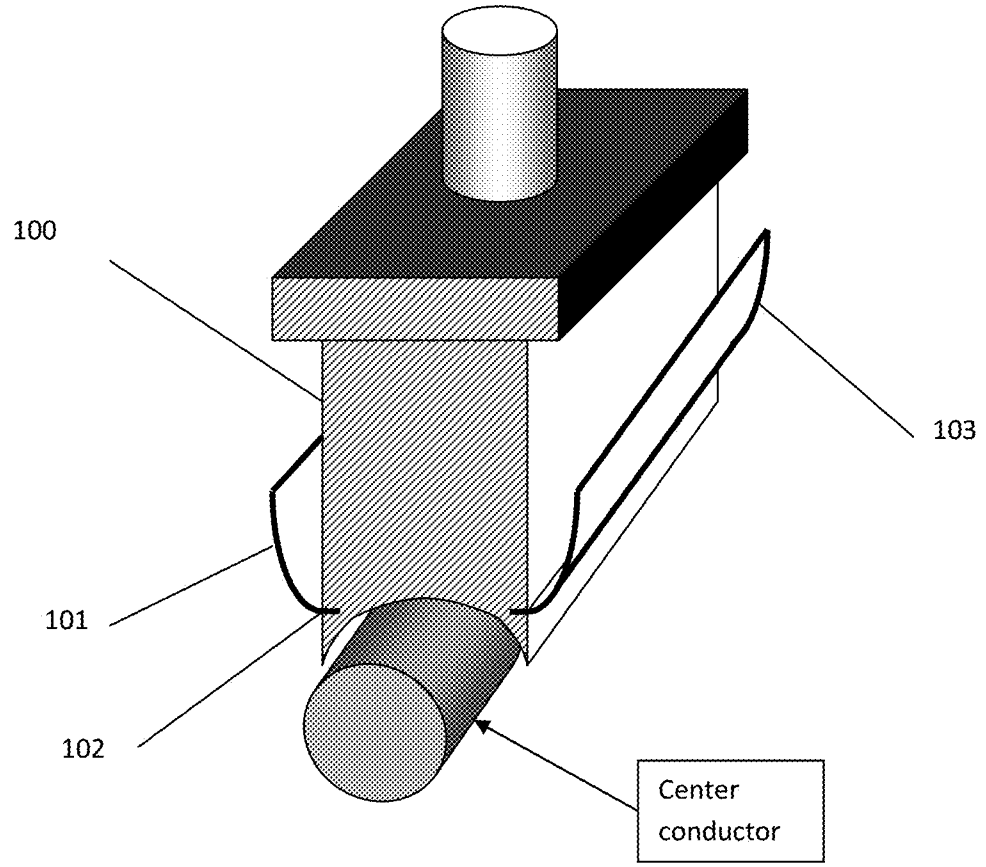
FIG. 10 depicts a perspective view of the probe of FIG. 9 having spring loaded sliding grounding contacts.
Figure 11:
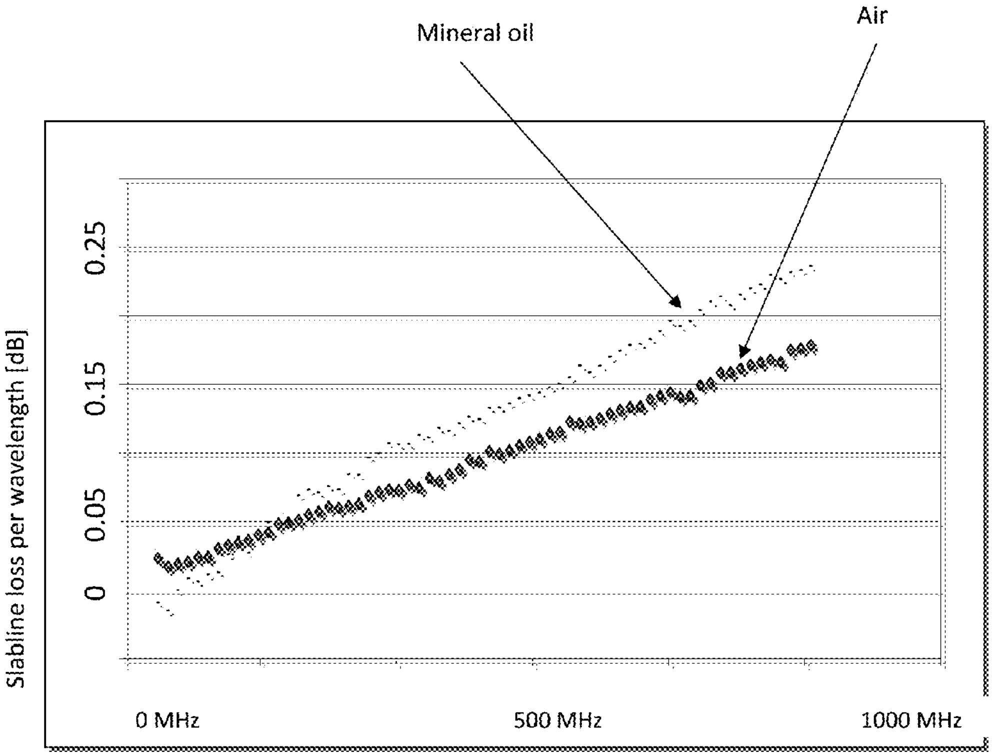
Figure 11 (prior art)
FIG. 11 depicts a comparison of measured slabline loss between a slabline filled with air and one filled with Mineral oil between 0 and 1000 MHz. The curves are normalized to the electrical wavelength.

Another, more flexible embodiment is shown in FIGS. 9 and 10: In this case the top slabs (69) and (601) are omitted and the adjustable grounding contact is established using flexible spring-loaded conductive foils (90), inserted (92) into horizontal slots on both side walls of the reflective probe (91). The sliding contacts expand as the slabline channel is widened and establish continuous grounding contact between the probe and the slabline walls without changing the thickness of the probe body. This type of sliding contact is advantageous compared to the ground contact shown in FIG. 8, because it is closer to ground and self-adjusting; therefore no mechanical manipulation is necessary in adjusting the position of the top slabs (69) and (601) in FIG. 6. The shortcoming is in the practically limited expansion range of such mechanism in view of the available spring loaded material (contact bronze for instance). A perspective view of the modified probe is shown in FIG. 10: two lateral slots (102) are cut into the body (100) of the probe, close to the concave bottom; and the sliding contact foils (101) and (103) are inserted and fixed. This way, when the slabline channel widens the contacts expand and stay in continuous contact with the grounded walls of the slabline.

When using dielectric material to fill the slabline the dielectric constant ($\in_r$) and associated loss (tan δ) is important. A high dielectric constant $\in_r$ is obviously preferable since the effective electric wavelength is $\lambda_{eff}=\lambda o/\sqrt{\in_r}$, whereby λo is the wavelength in air (or vacuum). However, as can be seen in the literature (see ref. 9 and FIG. 13) liquids with high $\in_r$ tend to have high losses (tan δ). In the case of tuners, losses are important, since they reduce the effective tuning range, by twice the insertion loss between the tuner test port and the tuning probe and the loss between the tuning probes in case of a multi-probe tuner. An effective "figure of merit" is then the ratio between loss and dielectric constant, included in FIG. 13 in the column (tan $\delta/\sqrt{\in_r}$). The smaller this number for comparable dielectric constants, the better the specific dielectric fluid will be suited for tuner applications. Of course $\in_r$ has to be high enough to cause a significant reduction in tuner length, this reduction being approximately "$1/\sqrt{\in_r}$".

Considering two examples: a) a single carriage tuner starting at Fmin=200 MHz. The effective length of such an apparatus is actually 80 cm (75 cm free travel=λ/2(200 MHz) plus 3 cm for the carriage and 2 cm for the two walls). Using a dielectric fluid with $\in_r$=3, the total length is reduced to 48.5 cm. b) In the case of a three carriage (harmonic) tuner starting at Fmin=400 MHz the associated dimensions are: b1) in air: 123.5 cm, b2) with dielectric: 76 cm. The size and weight reduction of roughly 40% in both cases is considerable and leads to reducing manufacturing cost and, most importantly, mounting effort and operation stability when tests are to be carried through on a wafer probe station (see ref. 6).

Using dielectric fluid for filling the slabline offers a number of additional benefits: a) lubrication: the probes can slide effortlessly on the side-walls of the slabline for perfect grounding contact without any wear out; b) higher capacitance: the maximum capacitance reached between the probe approaching the center conductor is increased by the factor $\in_r$ for the same gap size (83); this increases the achievable reflection factor at the probe reference plane; c) reduction of electric field: the electric field E between (grounded) probe and center conductor is reduced: the voltage V between center conductor and probe is: $V=\in_r*E*S$, whereby "S" is the gap between center conductor and probe (83); or $E=V/(\in_r*S)$: i.e. the electric field across the gap is reduced by a factor $1/\in_r$, which automatically reduces the risk of Corona discharge; and finally d) provides better cooling of the center conductor: filling the cavity of the slabline with a liquid provides for better heat removal (cooling) of the center conductor, which in normal, air filled slabline tuners, is thermally insulated from the environment and heats up easily at high transmitted power.

Figure 1:
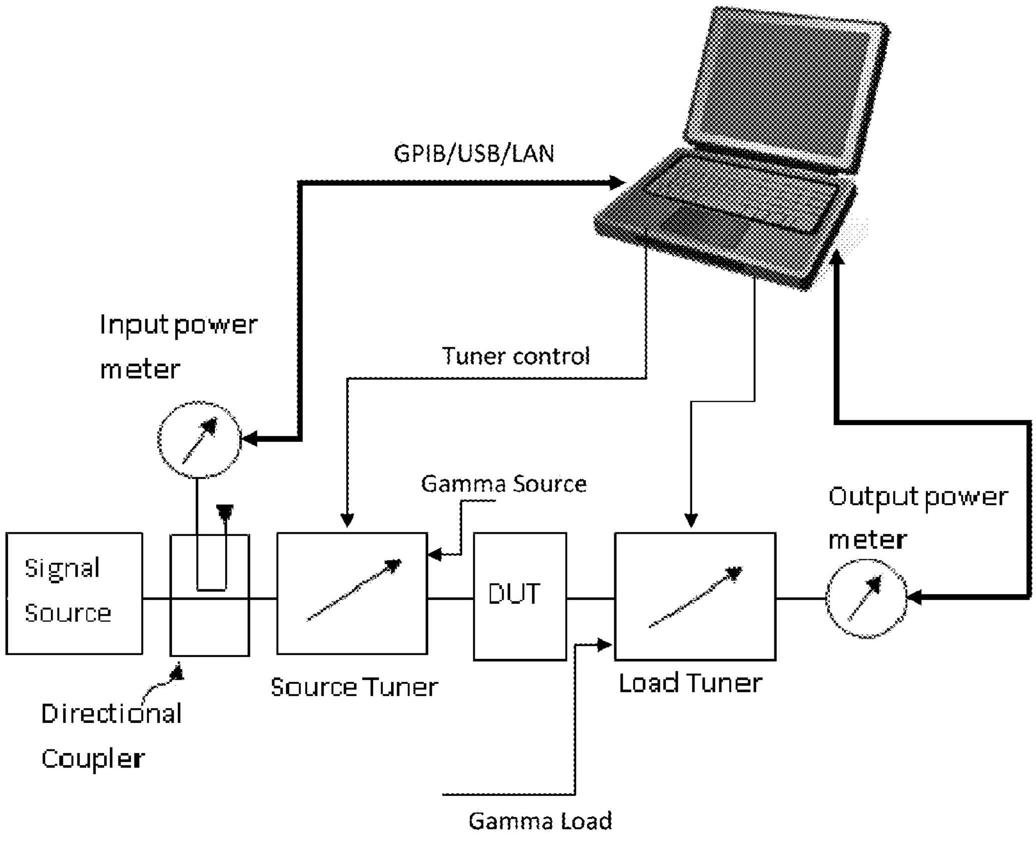
Figure 1 (prior art)
FIG. 1 depicts prior art, a typical load pull test setup using impedance tuners to test RF transistors.
Figure 2:
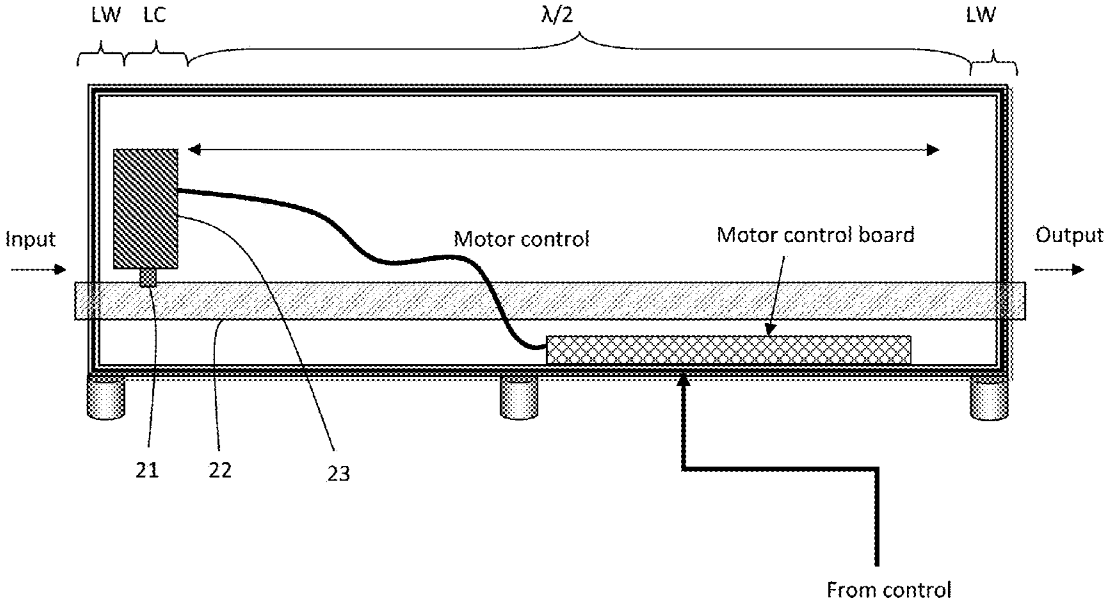
Figure 2 (prior art)
FIG. 2 depicts prior art, a) schematics of a single carriage slide screw tuner and definitions of basic elements determining its length; b) a cross section of the slabline (22) and the tuning probe (23).
Figure 2:
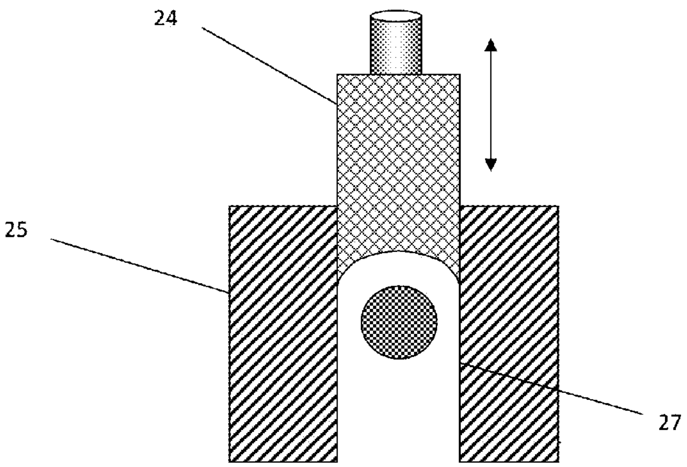
Figure 2 (prior art)
Figure 3:
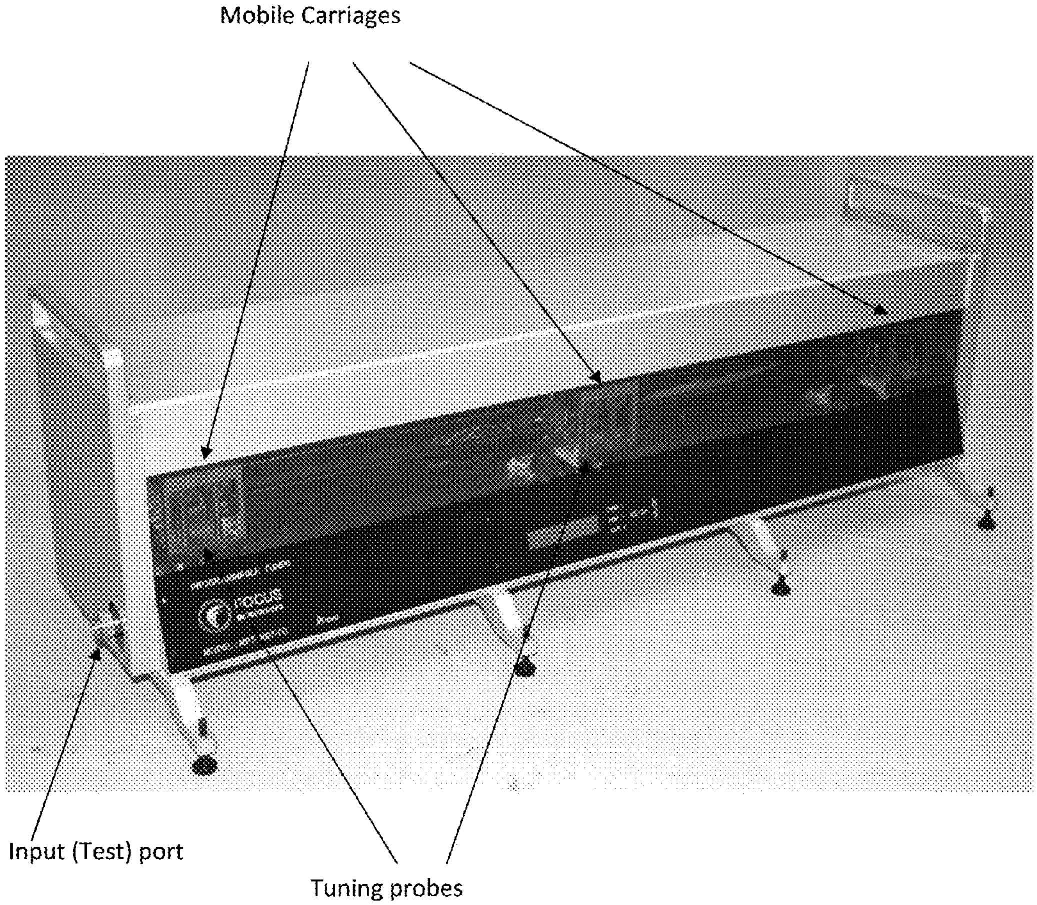
Figure 3 (prior art)
FIG. 3 depicts prior art, a photograph of an actual three carriage harmonic tuner and its actual size with a lowest frequency of operation of 0.7 GHz (700 MHz).
Figure 4:
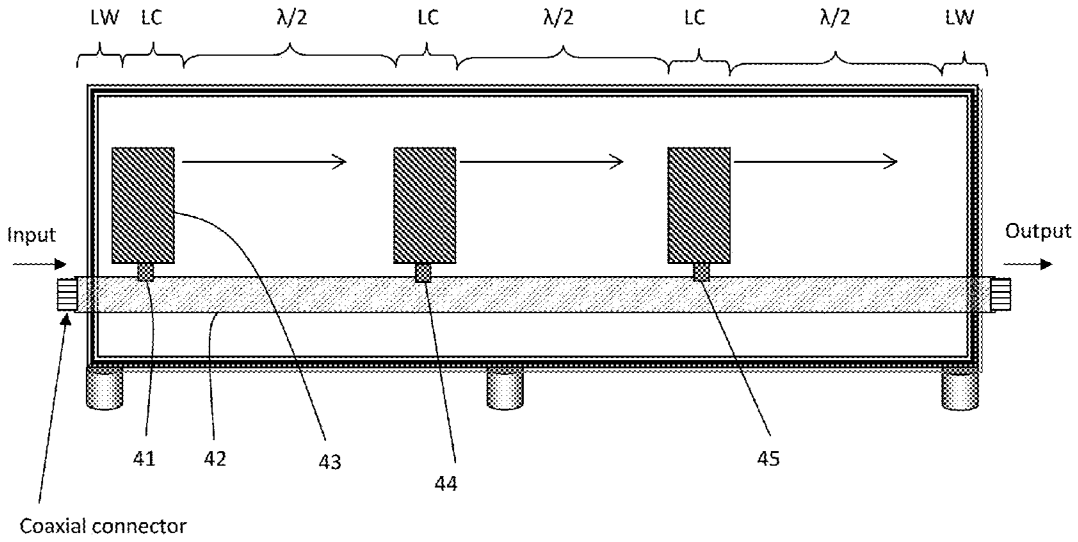
Figure 4 (prior art)
FIG. 4 depicts prior art, a schematics of an actual three carriage harmonic tuner and the definitions of all components determining the total tuner length.

In order to be used in automatic measurements an impedance tuner has to be automated and calibrated: automation means that the carriages and probes must be attached to and driven by gear mechanisms which will be controlled by electrical motors, preferably stepper motors and controlled by a central or on-board processor; calibration is necessary in order to be able to extract the DUT data from the measurement setup (FIG. 1).

Figure 12:
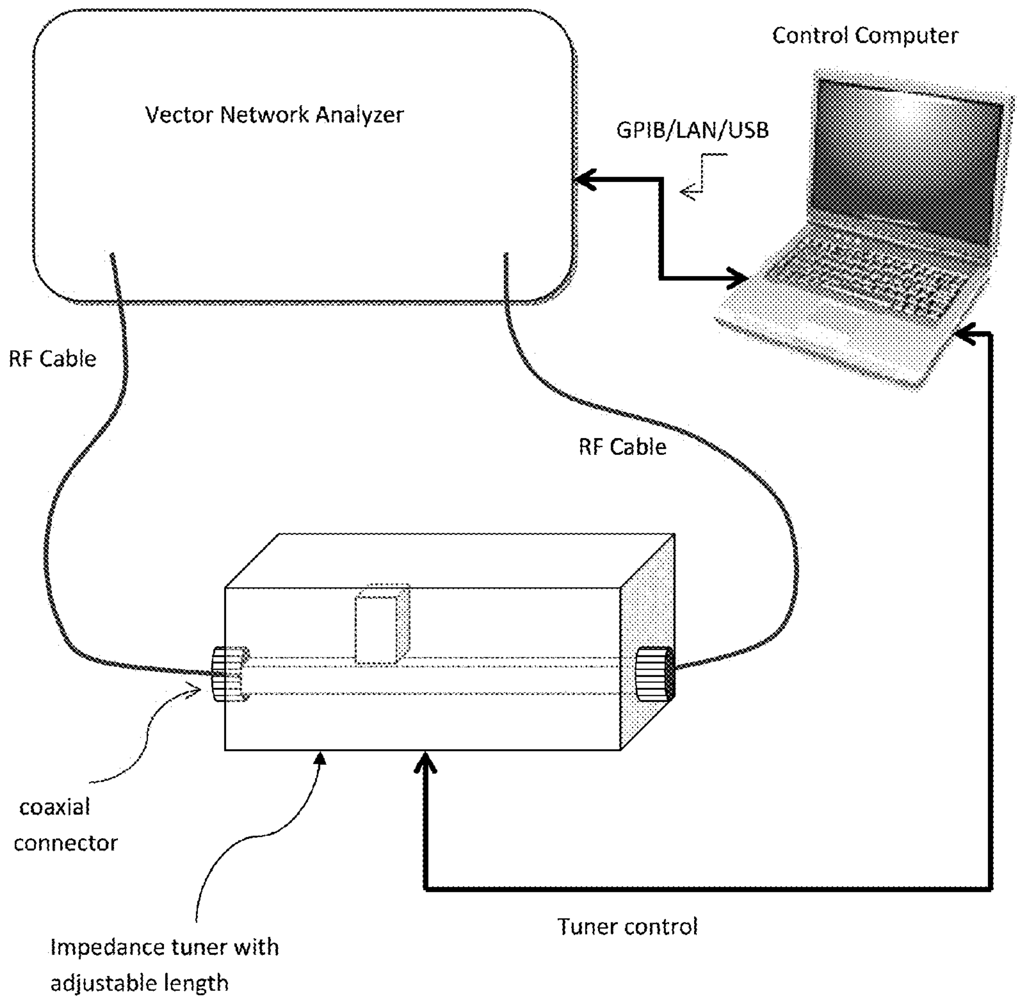
FIG. 12 depicts a tuner calibration setup.

A tuner calibration setup is shown in FIG. 12; a control computer communicates with a pre-calibrated network analyzer (VNA) which is connected through its test ports to the tuner two-port using high quality RF cables; an appropriate algorithm determines the horizontal and vertical probe positions (in stepper motor steps) needed to create a plurality of reflection factors (impedances) covering the tuning area of interest. Typically such area is the whole Smith chart, since it is often not known ahead of time where the optimum conditions for testing a DUT are; therefore the free horizontal travel for the carriage has to be at least one half of a wavelength at the test frequency; this corresponds to a 360 degree circle on the Smith chart. The S-parameters (see ref. 8) of the tuner two-port measured by the VNA for said probe positions are retrieved by the computer via digital communication (USB, GPIB or LAN) and saved in calibration files in a format which associates S-parameters with probe positions. After the calibration the data are retrieved by the measurement routines, embedded with the test fixture parameters, in which the DUT is mounted, and applied as corrections to the data measured in the test setup (FIG. 1), in order to generate corrected measurement data referred to the DUT itself (phase and amplitude corrections of the reflection factor and amplitude corrections of input and output power etc. (see ref. 1)).

This invention discloses a method for mechanically adjusting the length of single and multi-carriage slide screw impedance tuners, manual or automatic, using a slabline filled with dielectric material; in a preferred embodiment the dielectric material is low loss silicon or mineral oil, but alternative substances are easily imaginable. The grounding of the tuning probe in the tuner is established either using conductive grounded slabs on top of the slabline or spring loaded grounding contacts mounted on the tuning probe itself. Obvious alternatives of low loss high dielectric fluids shall not impede on the validity of the disclosed invention.

What I claim is:

1. A method for adjusting the electrical length of slide-screw impedance tuners, while keeping the characteristic impedance, center conductor, tuning probe and coaxial connectors unchanged, said tuners comprising:
- an input (test) port and an output (idle) port and having coaxial connectors attached to said ports,
- and a slotted airline (slabline) between said ports,
- said slabline comprising a center conductor and two vertical grounded sidewalls,
- and at least one mobile carriage travelling parallel to the axis of said slabline,
- said carriage(s) carrying metallic tuning probes capacitively coupled to the center conductor of said slabline,
- said probes being insertable into the slot of said slabline and positioned at various distances from said center conductor and from said tuner test port, whereby creating adjustable reflection factors,
- said method for adjusting the electrical length of said tuner comprising the following steps:
- a) introducing dielectric material into the slabline channel,
- b) adjusting the width of said channel by adjusting the space between the slabline walls,
- c) maintaining electrical contact between the ground walls of said slabline and the tuner probe(s).

2. A tuner as in claim 1, whereby said dielectric material is low loss high electrical permittivity (epsilon) dielectric liquid.

3. A tuner as in claim 2, whereby the width of the slabline channel is adjustable, allowing creating characteristic impedance of said slabline equal to the characteristic impedance of the coaxial connectors attached to said input and output ports.

4. A tuner as in claim 3, whereby said tuning probe is grounded using adjustable lateral conductive slabs mounted on top of said slabline, parallel to the axis of said slabline and making electrical contact with the top of the slabline walls and sliding electrical contact with the moving probe.

5. A tuner as in claim 4, whereby said slabs are adjustable perpendicularly to the axis of said slabline.

6. A tuner as in claim 3, whereby said tuning probe has spring loaded grounding contacts mounted on both sides of said probe between said probe and said slabline walls.

7. Probes as in claim 6, whereby said spring loaded contacts establish continuous self-adjustable ground contact between the tuning probe and the slabline walls.

8. A tuner as in claim 1, whereby said mobile carriages and tuning probes are positioned by mechanical gear driven by electrical stepper motors and associated motor control circuitry.

9. A tuner as in claim 8, whereby said electrical motors and mechanical gear, positioning said carriages and probes, are remotely controlled by a computer running appropriate control software.

10. A calibration method for a tuner as in claim 9, whereby said tuner has one carriage, said carriage carrying at least one probe,
- in following steps:
- a) connect said tuner to a pre-calibrated network analyzer being in operational communication with said control computer,
- b) set the tuner probe to a plurality of pre-determined horizontal and vertical positions, measure S-parameters of the tuner two-port at a given frequency and save in a calibration file ready for retrieval.

11. A calibration method for a tuner as in claim 9, whereby said tuner has two independently movable carriages, each said carriage carrying at least one probe, in following steps:

a) select one probe per carriage, probe 1 being associated with the carriage closer to the test port and probe 2 with the second carriage, b) connect said tuner to a pre-calibrated network analyzer being in operational communication with said control computer, c) withdraw all tuner probes from the slabline (initialize) and measure S-parameters of the tuner two-port at a given frequency, saving in file [S0], d) set the tuner probe 1 to a plurality of pre-determined horizontal and vertical positions, leaving probe 2 initialized, and measure S-parameters of the tuner two-port for said probe 1 positions and save in a file [S1], e) initialize probe 1, f) set the tuner probe 2 to a plurality of pre-determined horizontal and vertical positions, leaving probe 1 initialized, and measure S-parameters of the tuner two-port for said probe 2 positions, g) cascade the inverse matrix $[S0]^{-1}$ with the S-parameters measured in step (f) and save in file [S2], h) cascade S-parameters in files [S1] and [S2] for all probe settings and save in a two-carriage tuner calibration file ready for retrieval.

12. A calibration method for a tuner as in claim 9, whereby said tuner has three independently movable carriages, each said carriage carrying at least one probe, said probe covering a selected frequency range of operation, in following steps:

a) select one probe per carriage, probe 1 being associated with the carriage closest to the test port and probe 3 with the carriage closest to the idle port, b) connect said tuner to a pre-calibrated network analyzer being in operational communication with said control computer, c) withdraw all tuner probes from the slabline (initialize) and measure S-parameters of the tuner two-port at a given frequency, saving in file [S0], d) set the tuner probe 1 to a plurality of pre-determined horizontal and vertical positions, leaving all other probes initialized, measure S-parameters of the tuner two-port for said probe 1 positions and save in a file [S1], e) initialize probe 1, f) set the tuner probe 2 to a plurality of pre-determined horizontal and vertical positions, leaving all other probes initialized and measure S-parameters of the tuner two-port for said probe 2 positions, g) cascade the S-parameters measured in step (f) with the inverse matrix $[S0]^{-1}$ and save in file [S2], h) initialize probe 2, i) set the tuner probe 3 to a plurality of pre-determined horizontal and vertical positions leaving all other probes initialized and measure S-parameters of the tuner two-port for said probe 3 positions, j) cascade the inverse matrix $[S0]^{-1}$ with the S-parameters measured in step (i) and save in file [S3], k) cascade S-parameters in files [S1], [S2] and [S3] for all probe settings and save in a three-carriage tuner calibration file ready for retrieval.

* * * * *